United States Patent
Yang

(10) Patent No.: US 12,400,869 B2
(45) Date of Patent: Aug. 26, 2025

(54) METHOD FOR SELECTIVELY REMOVING PREDETERMINED PART OF SELECTED ELEMENT IN SEMICONDUCTOR STRUCTURE

(71) Applicant: TAIWAN SEMICONDUCTOR MANUFACTURING COMPANY, LTD., Hsinchu (TW)

(72) Inventor: Chansyun David Yang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 573 days.

(21) Appl. No.: 17/866,059

(22) Filed: Jul. 15, 2022

(65) Prior Publication Data

US 2024/0021432 A1 Jan. 18, 2024

(51) Int. Cl.
*H01L 21/311* (2006.01)
*H01L 21/02* (2006.01)

(52) U.S. Cl.
CPC .... *H01L 21/31116* (2013.01); *H01L 21/0206* (2013.01)

(58) Field of Classification Search
CPC .......... H01L 21/31116; H01L 21/0206; H01L 21/28176; H01L 21/31122; H01L 21/31155
See application file for complete search history.

(56) References Cited

U.S. PATENT DOCUMENTS

| | | | | |
|---|---|---|---|---|
| 5,950,083 A * | 9/1999 | Inoue | ............... | H10D 84/038 438/655 |
| 8,999,855 B2 * | 4/2015 | Honda | ............... | H01L 21/28052 438/738 |
| 2007/0254491 A1 * | 11/2007 | Cheung | ............... | H01L 21/3105 438/758 |
| 2013/0252411 A1 * | 9/2013 | Honda | ............... | H01L 21/28052 438/586 |
| 2015/0072533 A1 * | 3/2015 | Muraki | ............... | H01L 21/67207 156/345.35 |
| 2016/0358780 A1 * | 12/2016 | Isogai | ............... | H01L 21/28185 |
| 2018/0223437 A1 * | 8/2018 | George | ............... | C23F 4/00 |
| 2020/0027740 A1 * | 1/2020 | Vervuurt | ............... | H01L 21/0337 |
| 2022/0037163 A1 * | 2/2022 | Yang | ............... | H01J 37/32357 |

* cited by examiner

*Primary Examiner* — Joshua L Allen
*Assistant Examiner* — Christopher Remavege
(74) *Attorney, Agent, or Firm* — Birch, Stewart, Kolasch & Birch, LLP

(57) ABSTRACT

A method for treating a semiconductor structure includes: disposing the semiconductor structure in a chamber; introducing a modifying agent into the chamber to modify a surface part of a dielectric element; and introducing a removing agent into the chamber while applying an electromagnetic radiation with a selected frequency to the chamber so as to permit the dielectric element to be selectively heated by the electromagnetic radiation to have a temperature higher than those of other elements of the semiconductor structure, and so as to permit the modified surface part of the dielectric element to be removed.

20 Claims, 8 Drawing Sheets

METHOD FOR SELECTIVELY REMOVING PREDETERMINED PART OF SELECTED ELEMENT IN SEMICONDUCTOR STRUCTURE

BACKGROUND

Selective etching has been widely adopted in semiconductor device fabrications to remove a selected element in a semiconductor structure. One of the challenges in selective etching is to achieve a high etching selectivity of the selected element over the remaining elements in the semiconductor structure, so as to effectively remove the selected element, while the remaining elements may remain intact. In view of this, the industry has been developing different methods to enhance etching selectivity and etching efficiency.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
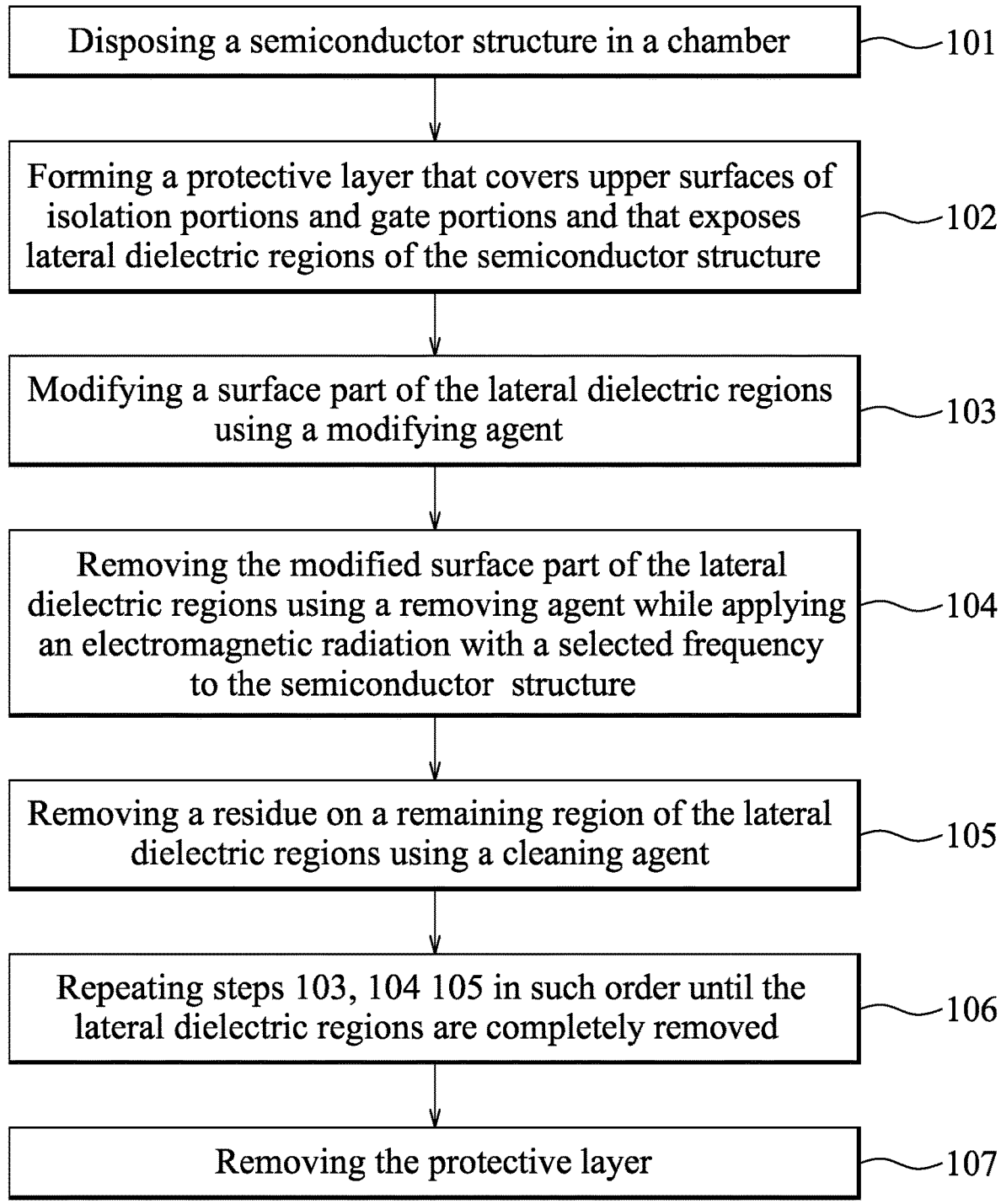
FIG. 1 is a flow diagram illustrating a method for selectively removing a predetermined part of a selected element in a semiconductor structure in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "top," "bottom," "upper," "lower," "over," "beneath," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to a method for treating a semiconductor structure, in which a selected element is first selectively heated, and then at least a part of the selected element is removed. The selective heating process is conducted by applying an alternating electric field with a selected frequency to a chamber where the semiconductor structure is disposed therein, such that the selected element is selectively heated by the alternating electric field to have a temperature higher than those of other elements of the semiconductor structure. The selected frequency allows the selected element to have a loss tangent which is greater than a loss tangent of each of the other elements, thereby achieving selective heating of the selected element.

In some embodiments, the selected element is a selected dielectric material. When an external electric field is applied to the selected dielectric material, the selected dielectric material is polarized to align with the applied electric field. Dielectric constant ($\varepsilon'$) reflects polarizability of the selected dielectric material. In the case that the alternating electric field, for example, but not limited to, an electromagnetic wave, is used, direction of the alternating electric field is switched constantly, and the selected dielectric material takes a certain period of time (known as relaxation time, and relaxation frequency is a reciprocal of the relaxation time) to switch its polarization in response to the alternating electric field. A frequency of the alternating electric field determines a time rate of change of the electric field in terms of direction. Interaction between the alternating electric field and the selected dielectric material gives rise to a heat energy that heats up the selected dielectric material. Such heat energy is known as dielectric loss and is reflected in dielectric loss factor ($\varepsilon''$). When the frequency of the alternating electric field exceeds the relaxation frequency of the selected dielectric material, polarization of the selected dielectric material cannot keep up with the alternating electric field, causing a decrease in dielectric constant of the selected dielectric material, resulting in increment of the dielectric loss factor (of the selected dielectric material) which acquires a peak value around the relaxation frequency. In addition, when loss tangent (tan $\sigma$) of the selected dielectric material, which is known as a ratio of dielectric loss factor ($\varepsilon''$) to dielectric constant ($\varepsilon'$), reaches its maximum value at a maximum loss tangent frequency, a maximal heating effect of the selected dielectric material is observed (the loss tangent frequency of the selected dielectric material depends on a thickness, a grain size, a film quality, a film density, and material properties thereof). Different dielectric materials respectively have maximum loss tangent frequencies that are different from one another, and that are determined from experiments. Therefore, by virtue of applying the alternating electric field with a frequency (serving as the abovementioned selected frequency) that equals to, or that is similar to the maximum loss tangent frequency of the selected dielectric material, the selected dielectric material has a maximum loss tangent, or a loss tangent greater than a loss tangent of each of the other elements, and the selected dielectric material is selectively heated to have a temperature higher than those of the other elements of the semiconductor structure. In some embodiments, the loss tangent frequency ranges from about 10 GHz to about 200 GHz. In some embodiments, for the selected dielectric material, the loss tangent frequency is similar to a frequency at which the dielectric loss factor of the selected dielectric material attains a maximum value. In addition, for dielectric material that has a relatively higher dielectric constant, dielectric loss thereof is also higher, causing greater heating effect and thus higher temperature.

Please note that, there are different types of polarization mechanisms, e.g., electronic polarization, ionic polarization, dipolar polarization and interfacial polarization, and the polarization mechanisms accordingly each has a corresponding loss tangent frequency. When considering which loss tangent frequency (of a corresponding one of the polarization mechanisms) should be used such that the selected dielectric material attains the most effective heating effect, it is also important to avoid damages to the semiconductor structure. For instance, in some embodiments, an electromagnetic radiation is provided to serve as the alternating electric field. Examples of the electromagnetic radiation include a radiofrequency radiation, a microwave radiation, an infrared radiation or a millimeter wave radiation, as these radiations are less likely to inflict damages to the semiconductor structure. In some embodiments, the electromagnetic radiation used has a frequency ranging from about 3 GHz to about 300 GHz. In other embodiments, the electromagnetic radiation used is the millimeter wave radiation. As such, the selected dielectric material is selectively heated to have a temperature higher than those of the other elements of the semiconductor structure. In some embodiments, the alternating electric field, i.e., the millimeter wave radiation is applied using a millimeter wave antenna device. In other embodiments, the alternating electric field is applied intermittently so as to prevent the other elements of the semiconductor structure from being heated up by the selected dielectric material.

In some embodiments, the selected element includes at least one of silicon oxide ($SiO_x$), silicon nitride ($SiN_x$), silicon carbide (SiC), silicon oxynitride (SiON), silicon oxycarbide (SiCO), silicon carbon oxynitride (SiCON), Zinc oxide ($ZnO_x$), hafnium oxide ($HfO_x$), hafnium zirconium oxide ($HfZrO_x$), zirconium oxide ($ZrO_x$), lanthanum oxide ($LaO_x$), aluminum oxide ($AlO_x$), titanium nitride (TiN), tungsten nitride (WN), tantalum nitride (TaN), molybdenum nitride (MoN), and hafnium nitride (HfN). Other suitable materials for the selected element are within the contemplated scope of the present disclosure.

Figure 2:
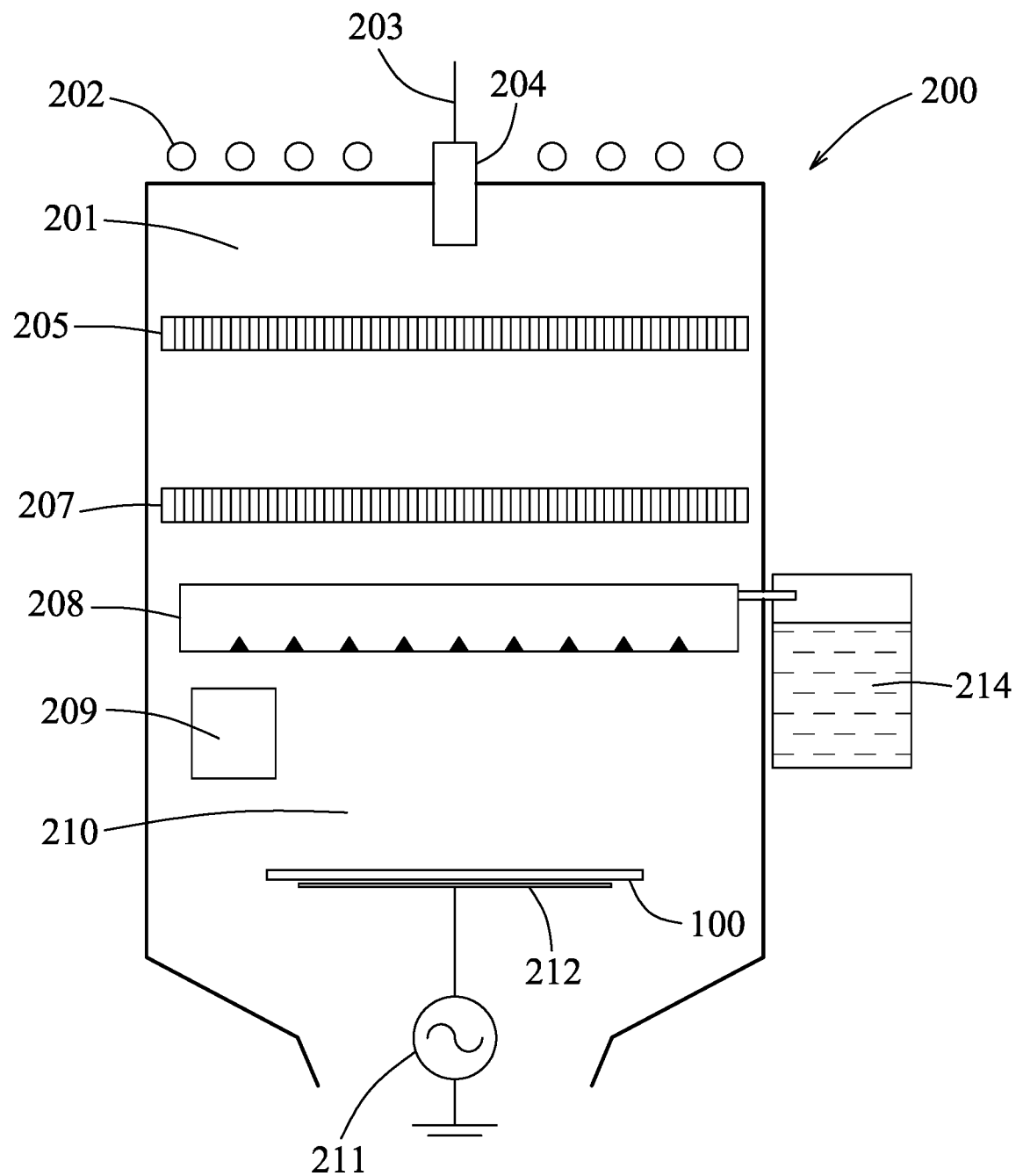
FIG. 2 is a schematic view of a system including a chamber in accordance with some embodiments.

In some embodiments, the semiconductor structure may be a metal-oxide-semiconductor field effect transistor (MOSFET) device, such as a planar MOSFET, a fin-type FET (FinFET), a gate-all-around (GAA) nanosheet FET, a GAA nanowire FET, or other suitable devices. Hereinafter, more details for applying the selectively removing method to a MOSFET are described, but not limited thereto. The method may also be applied to any other suitable devices. FIG. 1 is a flow diagram illustrating the method for selectively removing the predetermined part of the selected element in a semiconductor structure in accordance with some embodiments. FIG. 2 is a schematic view of a system 200 including a chamber 201 therein in accordance with some embodiments. FIGS. 3 to 8 illustrate schematic views of the intermediate stages of the method in accordance with some embodiments. Some repeating portions and/or other portions in FIGS. 3 to 8 are omitted for the sake of brevity. Additional steps can be provided before, after or during the method, and some of the steps described herein may be replaced by other steps or be eliminated.

Figure 3:
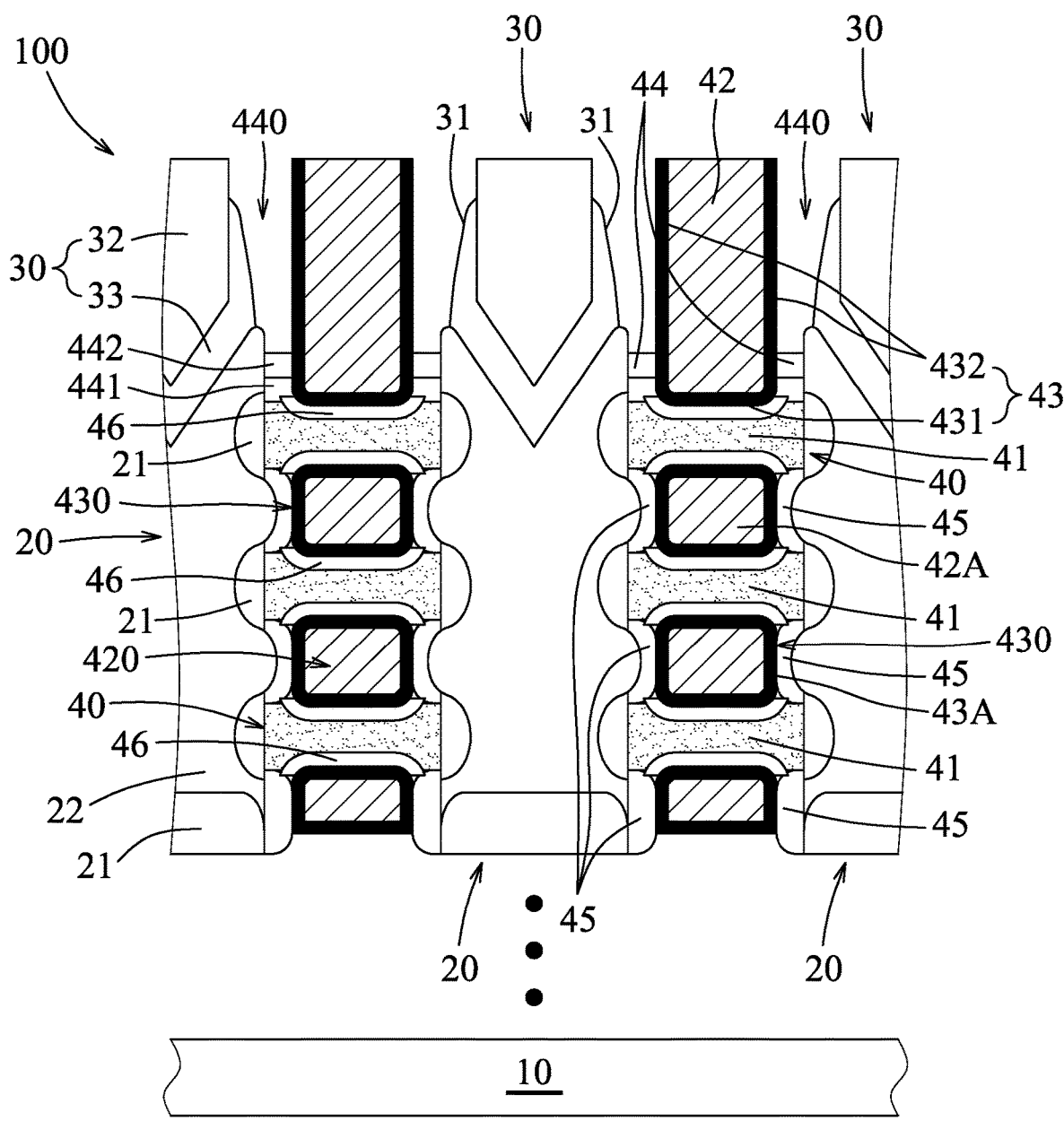
FIGS. 3 to 8 are schematic views illustrating intermediate stages of the method for selectively removing the predetermined part of the selected element in the semiconductor structure in accordance with some embodiments.

Referring to FIG. 1, and the examples illustrated in FIGS. 2 and 3, the method begins at step 101, where a semiconductor structure 100 is disposed in the chamber 201. FIG. 3 is an enlarged schematic view of the semiconductor structure 100 in accordance with some embodiments. Subsequent steps of the method according to the disclosure will be performed in the chamber 201. In some embodiments, the semiconductor structure 100 is held by a holder 212, and is kept at a predetermined range of temperature (e.g., about 150° C. to about 350° C.) throughout the subsequent steps. In some embodiments, the holder 212 is an electrostatic chunk. Other suitable temperature ranges for the semiconductor structure 100 and/or other suitable tools for holding the semiconductor structure 100 are within the contemplated scope of the present disclosure.

The semiconductor structure 100 includes a substrate 10, two source/drain portions 20, two isolation portions 30, a channel layer 41, a gate portion 42, a gate dielectric portion 43, and two gate spacers 44. The source/drain portions 20 are formed above the substrate 10 to be separated from each other. Each of the source/drain portions 20 may refer to a source or a drain, individually or collectively dependent upon the context. The isolation portions 30 are respectively formed on the source/drain portions 20, and each has two lateral surfaces 31 opposite to each other. In some embodiments, the lateral surfaces 31 may be inclined relative to the gate spacers 44. The channel layer 41 interconnects the source/drain portions 20. The gate portion 42 is disposed on the channel layer 41 and between the isolation portions 30. The gate dielectric portion 43 has a lower dielectric region 431 which is disposed to separate the gate portion 42 from the channel layer 41, and two lateral dielectric regions 432 which are disposed at two opposite sides of the gate portion 42 to be spaced apart from the isolation portions 30, respectively. The two gate spacers 44 are disposed on the channel layer 41 at two opposite sides of the gate dielectric portion 43.

Referring to FIG. 3, in some embodiments, the semiconductor structure 100 is a gate-all-around (GAA) structure (but is not limited thereto), and includes the substrate 10, a plurality of the source/drain portions 20, a plurality of channel portions 40 each including a plurality of the channel layers 41 interconnecting two corresponding adjacent ones of the source/drain portions 20, a plurality of the isolation portions 30 respectively disposed on the source/drain portions 20, a plurality of gate features 420 each surrounding the channel layers 41 of a corresponding one of the channel portions 40, and a plurality of gate dielectric features 430 disposed to separate a corresponding one of the gate features 420 from the corresponding channel portion 40. The substrate 10 may be a silicon-on-insulator (SOI) substrate, a germanium-on-insulator (GOI) substrate, a bulk semiconductor substrate (e.g., a bulk silicon substrate). Each source/drain portions 20 includes two, but is not limited thereto, epitaxial layers. Each of the epitaxial layers may include a semiconductor epitaxial material (for example, silicon, silicon germanium, or other suitable materials) doped with n-type and/or p-type dopant(s). In some embodiments, each of the source/drain portions 20 includes a first epitaxial layer having a plurality of epitaxial regions 21 which are formed on the substrate 10 and on lateral surfaces of the channel layers 41 of two corresponding adjacent ones of the channel portions 40, and a second epitaxial layer 22 interconnecting the epitaxial regions 21. Each of the isolation portions 30 includes an interlayer dielectric (ILD) layer 32 and a contact etch stop layer (CESL) 33 disposed between the interlayer dielectric (ILD) layer 32 and a corresponding one of the source/drain portions 20. The CESL 33 may include, for example, but not limited to, silicon nitride, carbon-doped silicon nitride, other suitable materials, or combinations thereof. The ILD layer 32 may include, for example, but not limited to, a dielectric material such as, but not limited to, silicon oxide, silicon nitride, silicon oxynitride, other suitable materials, or combinations thereof. Each of the channel layers 41 may include, for example, but not limited to, silicon, or other suitable materials. Each of the gate features 420 includes the gate portion 42 disposed on an uppermost one of the channel layers 41 of the corresponding channel portion 40, and a lower gate portion 42A extending downwardly from the gate portion 42 to surround the channel portions 41 of the corresponding channel portion 40. Each of the gate features 420 includes a conductive material such as, aluminum, tungsten, copper, titanium nitride, other suitable materials, or combinations thereof. Each of the gate dielectric features 430 includes the gate dielectric portion 43 disposed on the uppermost one of the channel portions 41 of the corresponding channel portion 40, and a lower gate dielectric portion 43A extending downwardly from the gate dielectric portion 43A to surround the lower gate portion 42A of a corresponding one of the gate features 420 so as to separate the lower gate portion 42A of the corresponding gate feature 420 from the channel layers 41 of the corresponding channel portion 40. Each of the gate dielectric features 430 includes silicon oxide, silicon nitride, silicon oxynitride, high dielectric constant (k) materials, other suitable materials, or combinations thereof. The semiconductor structure 100 also includes a plurality of pairs of the gate spacers 44, each pair of which is disposed on the uppermost one of channel layers 41 of the corresponding channel portion 40 and at two opposite sides of the gate dielectric portion 43 of the corresponding gate dielectric feature 430. Each of the gate spacers 44 may include silicon oxide, silicon nitride, or a combination thereof. In some embodiments, each of the gate spacers 44 includes two spacer layers 441, 442. Spacers (not shown) are originally filled in gaps 440 among the isolation portions 30, the gate dielectric portions 43 of the dielectric features 430, and are etched back to form the spacer layers 441 of the gate spacers 44. Then, the spacer layers 442 of the gate spacers 44 are formed to enhance chemical resistance to treatment(s) in subsequent steps. In addition, the semiconductor structure 100 may further include a plurality of inner spacers 45 and a plurality of interfacial layers 46. Each of the inner spacers 45 is disposed to separate a corresponding one of the source/drain portions 20 from a portion of the corresponding gate dielectric feature 430. The inner spacers 45 may each include silicon oxide, silicon nitride, silicon oxynitride, high dielectric constant materials, other suitable materials, or combinations thereof. Each of the interfacial layers 46 is formed on a surface of a corresponding one of the channel layers 41. Other suitable materials for forming the semiconductor structure 100 are within the contemplated scope of the present disclosure.

In the semiconductor structure 100, the gate electric portion 43 can serve as a selected dielectric element, and the lateral dielectric regions 432 exposed from the gate spacers 44 can serve as a predetermined part of the selected dielectric element to be removed. In some embodiments, the gate electric portion 43, i.e., the selected dielectric element, is made of hafnium oxide (HfO$_x$), but is not limited thereto, and the lateral dielectric regions 432, i.e., the predetermined part of the selected dielectric element, are to be removed subsequently by an atomic layer etching (ALE) process, but not so limited.

Figure 4:
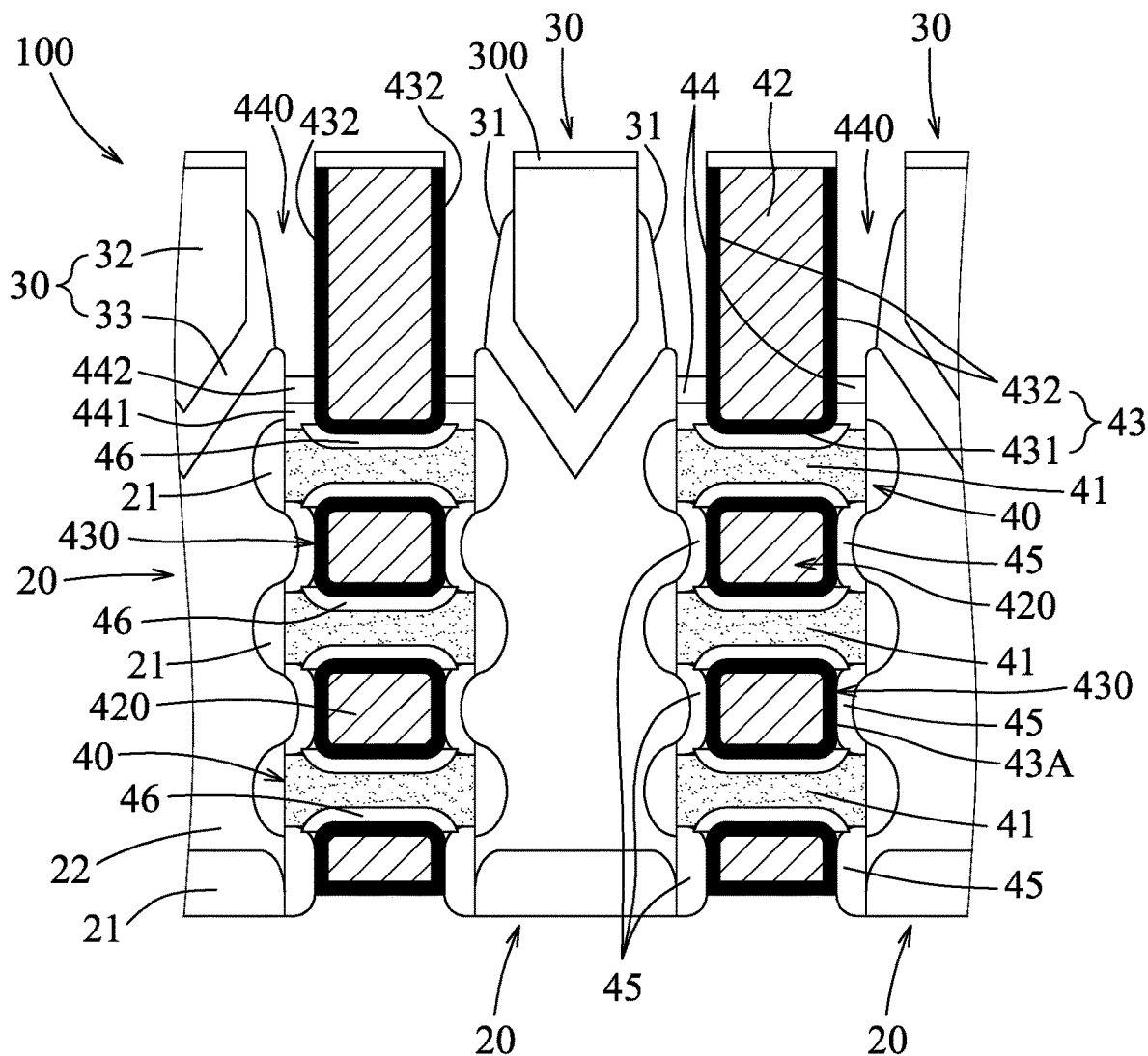

Referring to FIG. 1 and the example illustrated in FIG. 4, the method proceeds to step 102, where a protective layer 300 is formed to cover upper surfaces of the isolation portions 30, the gate portions 42 of the gate features 420, and the lateral dielectric regions 432 of the gate dielectric features 430, such that lateral surfaces of the lateral dielectric regions 432 are exposed from the protective layer 300. The protective layer 300 is configured to protect the isolation portions 30 and the gate portions 42 from being damaged in the steps that are performed subsequently.

In some embodiments, the protective layer 300 may be formed using a plasma treatment. In some embodiments, the plasma treatment is directional, so as to allow the protective layer 300 to be formed mainly on the upper surfaces of the isolation portions 30, the gate portions 42, and the lateral dielectric regions 432. In some embodiments, the protective layer 300 is formed with a thickness ranging from about 1.5 nm to about 5.0 nm. When the thickness is less than about 1.5 nm, the protective layer 330 may not provide sufficient protection to the isolation portions 30 and the gate portions 42. When the thickness is greater than about 5.0 nm, it may be difficult to remove the protective layer 330 later in step 107. In some cases that aspect ratios of the gaps 440 are relatively high, upper surfaces of the gate spacers 44 will not be formed with the protective layer 300. In other cases that aspect ratios of the gaps 440 are relatively small, the upper surfaces of the gate spacers 44 may also be formed with the protective layer 300, but is much thinner than the protective layer 300 formed on upper surfaces of the isolation portions 30, the gate portions 42, and the lateral dielectric regions 432. Other suitable processes for forming the protective layer 300 are within the contemplated scope of the present disclosure.

In some embodiments, as shown in FIG. 2, the system 200 further includes a gas line 203 for delivering precursor materials/gases that are intended to form plasmas into the chamber 201; a transformer coupled plasma (TCP) coil 202 that converts the precursor materials/gases into plasmas; a nozzle 204 that is connected to the gas line 203 and that releases the plasmas into the chamber 201; a first plate 205 that has a plurality of uniformly distributed openings so as to evenly distribute the plasmas released from the nozzle 204; a second plate 207 that serves as an ion filter to filter out ions present in the plasmas and to permit passage of radicals in the plasmas; and a bias 211 that drives radicals in the plasmas towards the patterned structure 100.

In some embodiments, in step 102, a precursor gas, when being introduced into the chamber 201, is delivered in the gas line 203, passes through the TCP coil 202 to form a plasma for forming the protective layer 300, and then the plasma flows into the chamber 201. The plasma is driven toward the semiconductor structure 100 through the first plate 205 to become evenly distributed, and is then brought through the second plate 207 so as to allow radicals, but not ions, to reach the semiconductor structure 100.

In some embodiments, the protective layer 300 may include boron nitride, a carbide, or an oxide. In some embodiments, the precursor gas for forming the protective layer 300 made of boron nitride may include boron trichloride and nitrogen, in addition to argon, hydrogen bromide, chlorine, methane, or other suitable materials. In some embodiments, boron trichloride is introduced at a flow rate ranging from about 70 sccm to about 150 sccm, nitrogen is introduced at a flow rate ranging from about 50 sccm to about 150 sccm, and argon is introduced at a flow rate ranging from about 100 sccm to about 300 sccm. When the flow rate is too high, for gaps 440 that have relatively high aspect ratios, portions of the protective layer 300, respectively formed on the upper surfaces of the isolation portions 30 and the gate portions 42 may merge with each other, or form into a mushroom shape. When the flow rate is too low, the protective layer 300 formed may be insufficient to cover the isolation portions 30 and the gate portions 42. The plasma deposition may be conducted at a temperature ranging from about 150° C. to about 350° C. under a pressure ranging from about 3 mTorr to about 20 mTorr. When the temperature is too high, a relatively small amount of boron nitride may be formed. When the temperature is too low, the portions of the protective layer 300, respectively formed on the upper surfaces of the isolation portions 30 and the gate portions 42 may merge with each other. When the pressure is too high, the portions of the protective layer 300, respectively formed on the upper surfaces of the isolation portions 30 and the gate portions 42 may merge with each other, or form into a mushroom shape. When the pressure is too low, boron nitride may be undesirably deposited on the lateral dielectric regions 432.

In other embodiments, the protective layer 300 made of a carbide is formed by carbonizing the upper surfaces of the isolation portions 30, the gate portions 42, and the lateral dielectric regions 432 using the directional plasma process. A precursor gas for forming the carbide may include alkane (e.g., methane), fluoroalkane (e.g., fluoromethane, difluromethane, and so on), or other suitable materials, or combinations thereof.

In yet other embodiments, the protective layer 300 made of an oxide is formed by oxidizing the upper surfaces of the isolation portions 30, the gate portions 42, and the lateral dielectric regions 432 using the directional plasma process. A precursor gas for forming the oxide may include silicon chloride, oxygen, or other suitable materials, or combinations thereof.

Other suitable materials and/or processes and/or conditions for forming the protective layer 300 are within the contemplated scope of the present disclosure.

Figure 5:
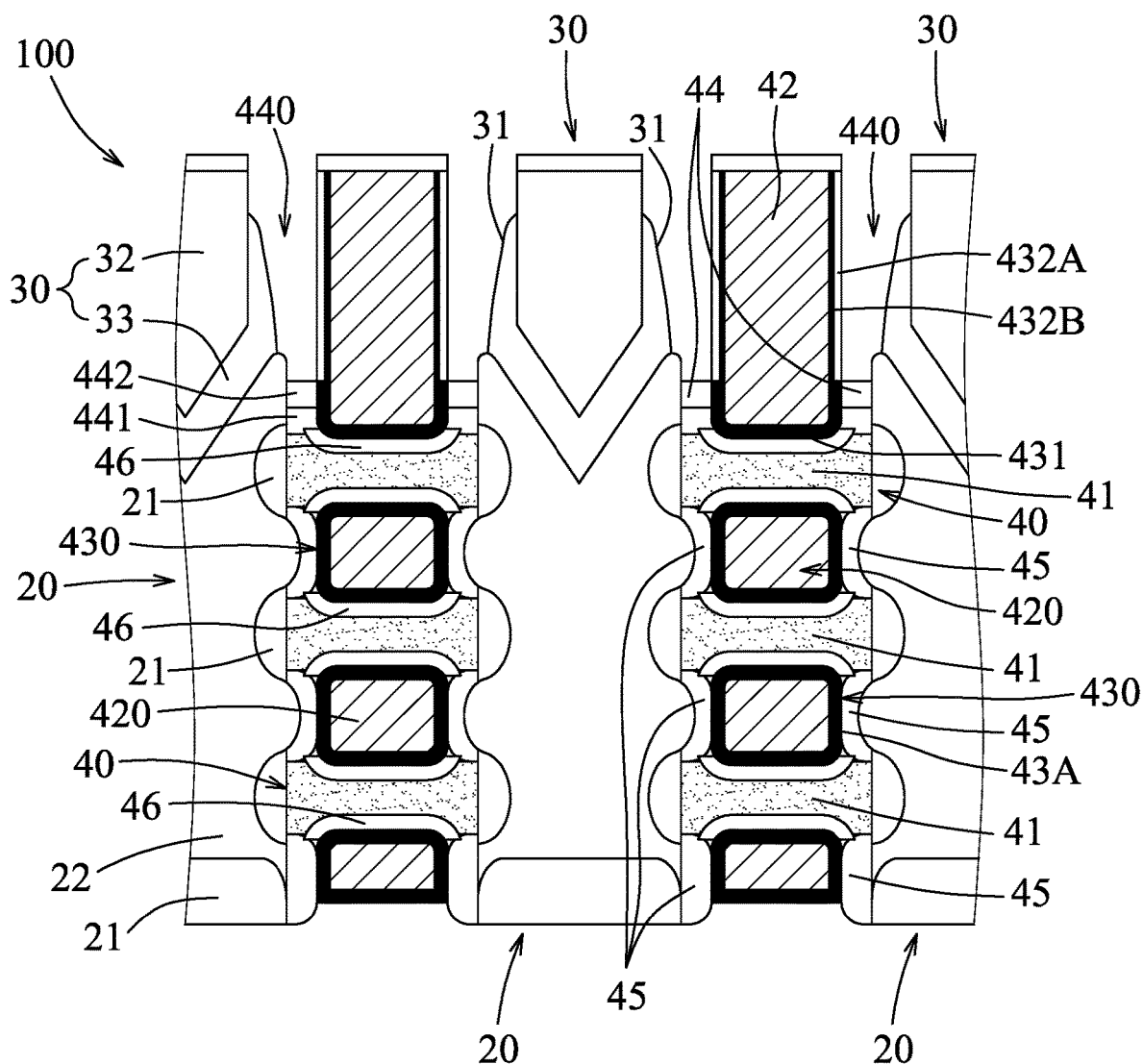

Referring to FIG. 1 and the example illustrated in FIGS. 2 and 5, the method proceeds to step 103, where a modifying agent is introduced into the chamber 201 to modify a surface part of the lateral dielectric regions 432 through the lateral surfaces of the lateral dielectric regions 432. In some embodiments, the modification is a fluorination process to fluorinate the surface part of the lateral dielectric regions 432, thereby forming the fluorinated surface part of the lateral dielectric regions 432A which is referred to as the fluorinated surface part 432A hereinafter, and which is to be removed in step 104 performed subsequently. In the fluorination process, hafnium oxide ($HfO_x$) is converted into hafnium fluoride ($HfF_x$). A remaining not fluorinated part of the lateral dielectric regions is denoted as a non fluorinated part 432B.

In some embodiments, the fluorination process is a plasma treatment process performed using a precursor including nitrogen trifluoride and hydrogen in the presence of argon and/or helium. The precursor gas is delivered in the gas line 203, passes through the TCP coil 202 to form a plasma for forming the fluorinated surface part 432A, and then the plasma flows into the chamber 201. The plasma is driven toward the semiconductor structure 100 through the first plate 205 to become evenly distributed, and is then brought through the second plate 207 so as to allow radicals, but not ions, to reach the semiconductor structure 100. In some embodiments, nitrogen trifluoride is introduced at a flow rate ranging from about 100 sccm to about 300 sccm, hydrogen is introduced at a flow rate ranging from about 400 sccm to about 2000 sccm, argon is introduced at a flow rate ranging from about 100 sccm to about 500 sccm, and helium is introduced at a flow rate ranging from about 100 sccm to about 500 sccm. When the flow rate is too high, a non-uniform surface fluorination may be induced, i.e., the fluorinated surface part 432A may have a non-uniform thickness. When the flow rate is too low, the fluorinated surface part 432A formed may be too thin or insufficient. The plasma treatment process may be conducted at a temperature ranging from about 150° C. to about 350° C. under a pressure ranging from about 1 Torr to about 5 Torr with a power ranging from about 400 W to about 1000 W for a time period ranging from about 5 seconds to about 30 seconds. By completing the plasma treatment process, the fluorinated surface part 432A may have a thickness ranging from about 2 Å to about 30 Å. Such pressure range allows successful generation of the plasma without causing damages to other elements of the patterned structure 100, such as the isolation portions 30 or the gate portions 42. Such temperature range ensures an adequate fluorination reaction rate without causing degradation of the semiconductor structure 100. When the power is too high, the semiconductor structure 100 may be damaged, or fluorination may undesirably take place on other elements. When the power is too low, the fluorinated surface part 432A formed may be too thin. When the time period of the fluorination is too long, some by-products may be formed on the semiconductor structure 100. When the time period is too short, the fluorinated surface part 432A formed may be insufficient to be reacted and to be removed in the next step.

Other suitable materials and/or processes and/or conditions for forming the fluorinated surface part 432A are within the contemplated scope of the present disclosure.

Figure 6:
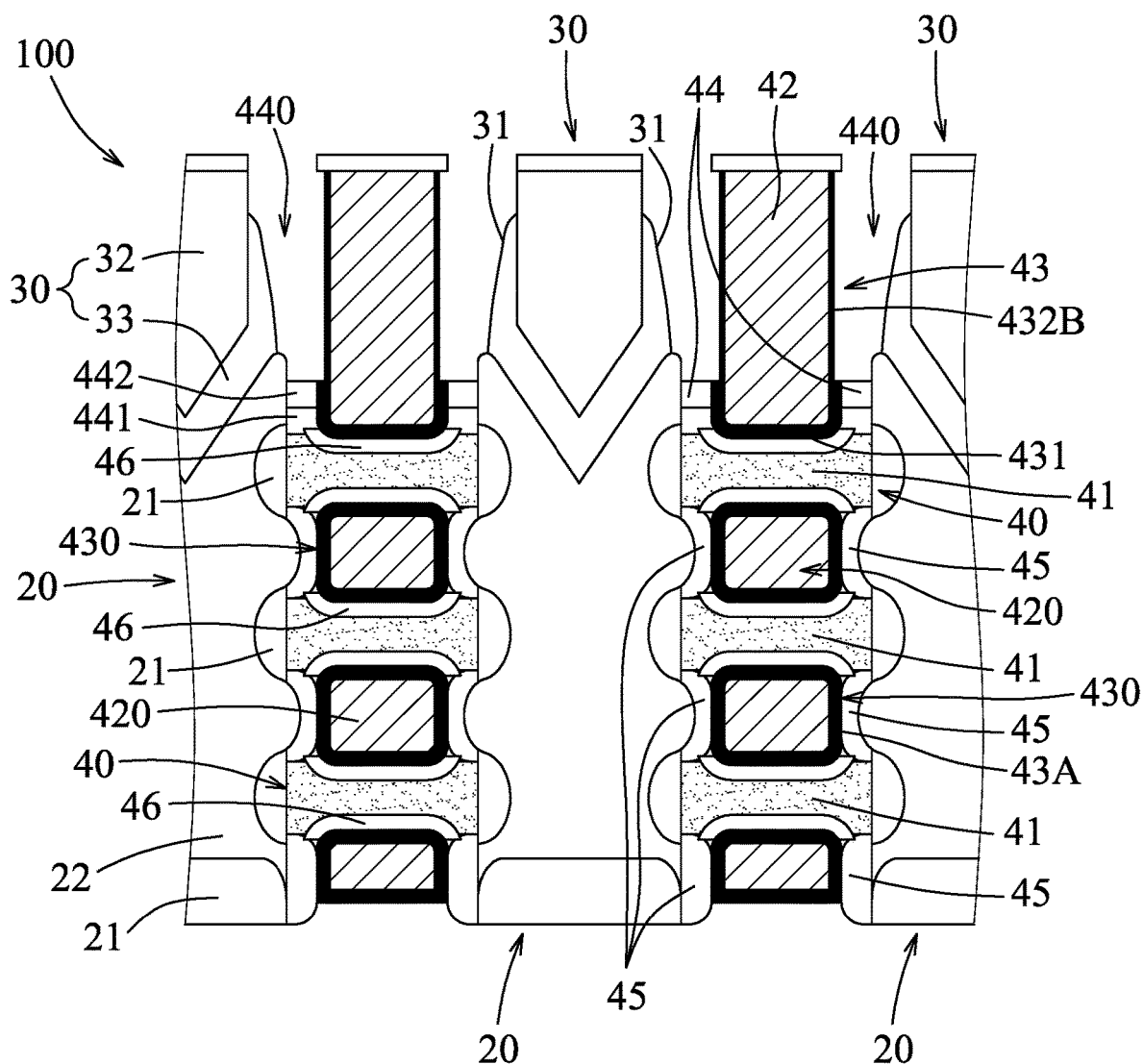

Referring to FIG. 1 and the example illustrated in FIGS. 2, 5 and 6, the method proceeds to step 104, where a removing agent is introduced into the etching chamber 201 while applying an electromagnetic radiation with a selected frequency to the chamber 201 so as to permit the gate dielectric portion 43 to be selectively heated by the electromagnetic radiation to have a temperature higher than those of the source/drain portions 20, the isolation portions 30, the channel portions 41, the gate portion 42, and the gate spacers 44, and so as to permit the modified surface part of the lateral dielectric regions 432, i.e., the fluorinated surface part 432A shown in FIG. 5, to be removed using the removing agent. In some embodiments, the selective heating process and the removal process are performed at the same time.

To perform the removal process, the removing agent is introduced to react with, and to thereby remove the fluorinated surface part 432A. In some embodiments, the removing agent includes a ligand exchange precursor such that a ligand exchange reaction occurs between the ligand exchange precursor and the fluorinated surface part of the dielectric element 43, i.e., the fluorinated surface part 432A, thereby removing the fluorinated surface part 432A. Other suitable methods for removing the fluorinated surface part 432A are within the contemplated scope of the present disclosure.

In some embodiments, the ligand exchange precursor includes trimethylaluminium ($Al_2Me_6$ or TMA), tin (II) acetylacetonate (Sn(acac)2), diethylaluminium chloride ($C_4H_{10}AlCl$ or DMAC), tetrachlorosilane ($SiCl_4$), boron trichloride ($BCl_3$), or titanium (IV) chloride ($TiCl_4$), in addition to the presence of helium, nitrogen or hydrogen. The ligand exchange precursor is introduced at a flow rate ranging from about 50 sccm to about 500 sccm. Such flow rate range ensures a complete removal of the fluorinated surface part 432A, without letting the ligand exchange precursor form residues on the patterned structure 100. In some embodiments, a plasma formed from a precursor gas including for example, but not limited to argon, hydrogen, helium, or combinations thereof is used to enhance the ligand exchange reaction. In some embodiments, a power supply ranges from about 300 W to about 1200 W. When the power is too high, the ligand exchange precursor may breakdown and thus not being available to remove the fluorinated surface part 432A. When the power is too low, not enough radicals (of the plasma) are generated to enhance the ligand exchange reaction. The ligand exchange reaction lasts for a time period ranging from 5 seconds to about 30 seconds to completely remove the fluorinated surface part 432A.

As shown in FIG. 2, the system 200 further includes a ligand exchange precursor tank 214 that is connected to the chamber 201 and that heats up the ligand exchange precursor; and a vapor nozzle plate 208 that has a plurality of evenly distributed openings. The ligand exchange precursor is introduced into the chamber 201, and is vaporized in the vapor nozzle plate 208 to be evenly distributed in a ligand exchange reaction zone 210, so as to react with, and to thereby remove the fluorinated surface part 432A. In some embodiments, the precursor gas is introduced into the chamber 201 via the gas line 203 and is formed into a plasma. By being driven through the first plate 205 and the second plate 207, radicals of the plasma reach the ligand exchange reaction zone 210 and enhance the ligand exchange reaction.

During the removal process, the gate dielectric portions 43 are simultaneously and selectively heated so as to enhance the ligand exchange reaction rate, and thus removal rate of the fluorinated surface part 432A. The selective heating process allows the gate dielectric portions 43 to have a temperature higher than the temperatures of the other elements of the semiconductor structure 100, such as the source/drain portions 20, the isolation portions 30, the channel portions 41, the gate portion 42, and the gate spacers 44. Compared to the molecules of other elements, molecules in the fluorinated surface part 432A therefore possess more kinetic energy, and can more easily overcome activation energy barrier for the ligand exchange reaction, thus the ligand exchange reaction rate is increased. In addition, even when the removing agent may also remove other elements made of, for example, but not limited to, titanium nitride, silicon oxide, silicon nitride, or other suitable materials (depending on the removing agent used), the selective heating process may also enhance reaction selectivity for the fluorinated surface part 432A over the other elements.

The selective heating process is performed by applying an electromagnetic radiation with a selected frequency to the chamber 201. In some embodiments, the electromagnetic radiation is a millimeter wave radiation that does not inflict damages to the semiconductor structure 100, and the selected frequency is a maximum loss tangent frequency of hafnium oxide ($HfO_x$), such that the gate dielectric portions 43 attain a maximum heating effect. In other embodiments, the selected frequency is a frequency similar to the maximum loss tangent frequency of hafnium oxide so as to provide an adequate heating effect to the gate dielectric portions 43. As such, the fluorinated surface part 432A of the gate dielectric portions 43 are selectively heated to have a temperature higher than those of the surrounding elements, such as, the source/drain portions 20, the isolation portions 30, the channel layers 41, the gate portions 42, or the gate spacers 44. Please note that, a maximum loss tangent frequency of hafnia fluoride ($HfF_x$) for heating the fluorinated surface part 432A is similar to the maximum loss tangent frequency of hafnium oxide ($HfO_x$), and thus hafnia fluoride ($HfF_x$) and hafnium oxide ($HfO_x$) (i.e., the fluorinated surface part 432A and a remaining of the gate dielectric portions 43) are heated at similar rates to achieve similar temperatures, which are significantly greater than those of the surrounding elements. In some other embodiments, the selected frequency is the maximum loss tangent frequency of hafnia fluoride ($HfF_x$).

In some embodiments, to achieve selective heating of the gate dielectric portion 43, the millimeter wave is applied intermittently. For instance, the power for applying the radiation may be a pulsating power with a duty cycle ranging from about 10% to about 90%, i.e., the power is on for about 10% to about 90% of the time throughout the selective heating process. In other embodiments, power may be switched on and off 1 to 10 times throughout the selective heating process. The millimeter wave is applied in pulse to ensure the gate dielectric portion 43 is heated to have a high enough temperature to increase ligand exchange reaction rate, without heating up other elements in the semiconductor structure 100 by conduction.

In some embodiments, a power to provide the radiation ranges from about 400 W to about 1200 W. When the power is too high, the dielectric portion 43 may be heated too fast and may undesirably heat up nearby elements by conduction. When the power is too low, the power may be insufficient to heat up the dielectric portion 43 and to create the temperature difference between the dielectric portion 43 and the other elements.

As shown in FIG. 2, in some embodiments, the selective heating process is performed using a millimeter wave antenna device 209 in the system 200. The millimeter wave antenna device 209 monitors and analyses the selective heating condition of the dielectric portions 43, so as to give out an output of millimeter wave radiation with precisely determined parameters over the semiconductor structure 100, thereby achieving a uniform heating of the dielectric portion 43. Examples of the parameters include radiation power, voltage, duty cycles, frequency modulation for phase, interference control, signal to noise ratio and so on, but are not limited thereto.

By completing step 104, the fluorinated surface part 432A is completely removed.

Other suitable materials and/or processes and/or conditions for removing the fluorinated surface part 432A are within the contemplated scope of the present disclosure.

Referring to FIG. 1 and the example illustrated in FIGS. 2 and 6, the method proceeds to step 105, where a cleaning agent is introduced into the chamber 201 to remove a residue on the non fluorinated part 432B after the ligand exchange reaction, so as to ensure a clean surface of the non fluorinated part 432B.

In some embodiments, the cleaning agent includes hydrogen, or helium, or a combination thereof. The cleaning agent may optionally also include argon. The cleaning agent is delivered in the gas line 203, passes through the TCP coil 202 to form a cleaning plasma for cleaning a surface of the non fluorinated part 432B, and then flows into the chamber 201 through the nozzle 204. The cleaning plasma is then brought through the first plate 205 so as to become evenly distributed, and is then brought through the second plate 207 so as to allow radicals to reach the semiconductor structure 100. In some embodiments, hydrogen is introduced at a flow rate ranging from about 500 sccm to about 2000 sccm, and helium is introduced at a flow rate ranging from about 500 sccm to about 2000 sccm, and argon is introduced at a flow rate ranging from about 200 sccm to about 2000 sccm. Such flow rate ranges ensure residues, if any, can be completely removed, without causing damage to the semiconductor structure 100. The removal of residue is performed at a pressure ranging from about 20 mTorr to about 200 mTorr for a time period ranging from about 3 seconds to about 30 seconds. A power ranging from about 300 W to about 12000 W is applied. Such pressure range and power range allow sufficient amount of the cleaning plasma to be formed, without causing damage to the patterned structure 100. Such time period range allows sufficient amount of time to completely remove any residues on the non fluorinated part 432B without damaging the patterned structure 100. The removal of residues may be conducted at a temperature ranging from about 150° C. to about 350° C. so as to provide sufficient cleaning performance without damaging the patterned structure 100.

Other suitable materials and/or processes and/or conditions for removing the residue on the non fluorinated part 432B are within the contemplated scope of the present disclosure.

Figure 7:
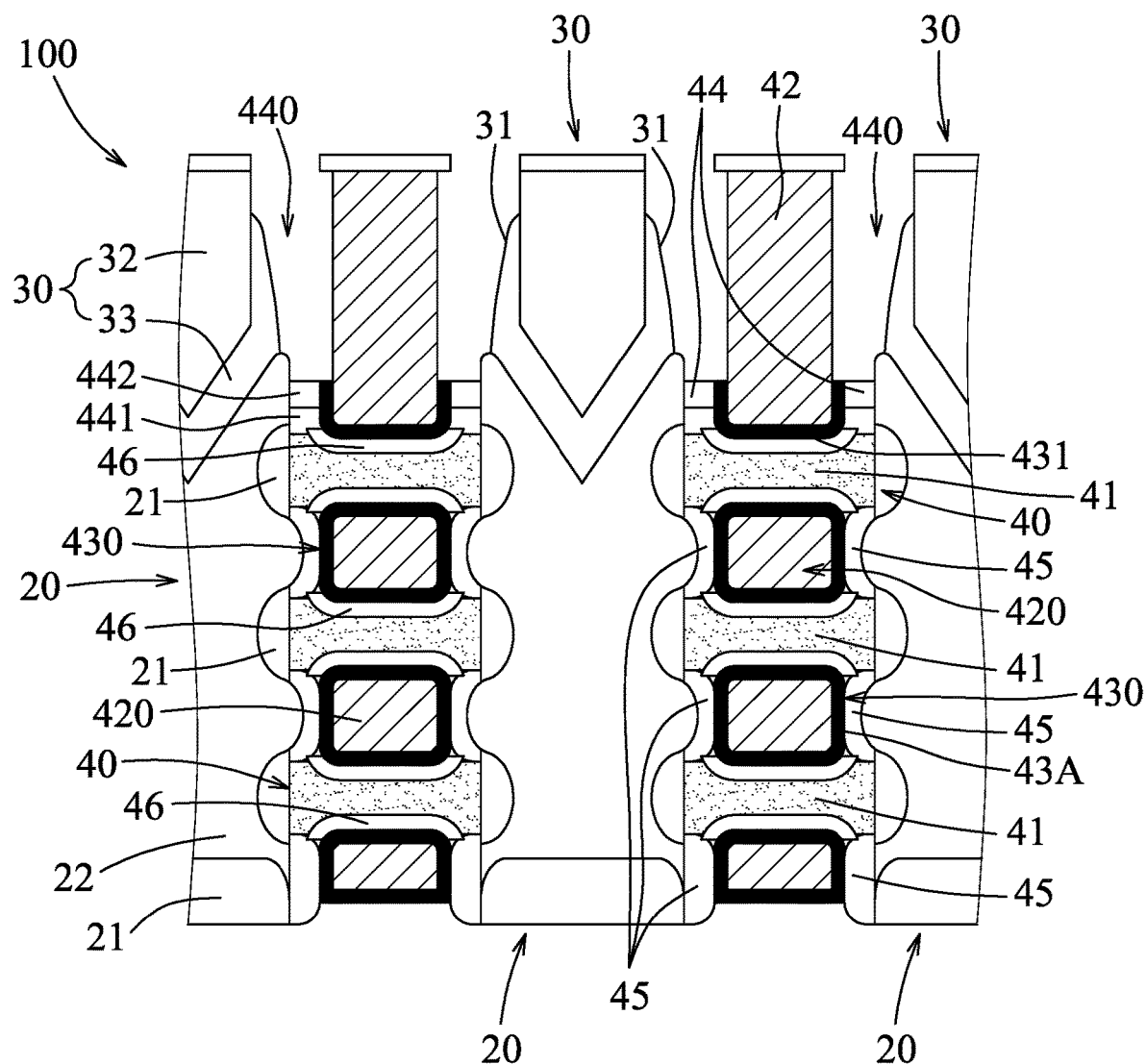

Referring to FIG. 1 and the example illustrated in FIG. 7, the method proceeds to step 106, where step 103 (introduction of the modifying agent), step 104 (introduction of the removing agent while applying the electromagnetic radiation), step 105 (introduction of the cleaning agent) are repeated in such order for a predetermined number of cycles, or until the lateral dielectric regions 432 shown in FIG. 3 are completely removed. In some embodiments, step 103, step 104, step 105 are performed for a total number of 2 to about 60 cycles so as to completely remove the lateral dielectric regions 432, thereby obtaining the structure shown in FIG. 7.

Figure 8:
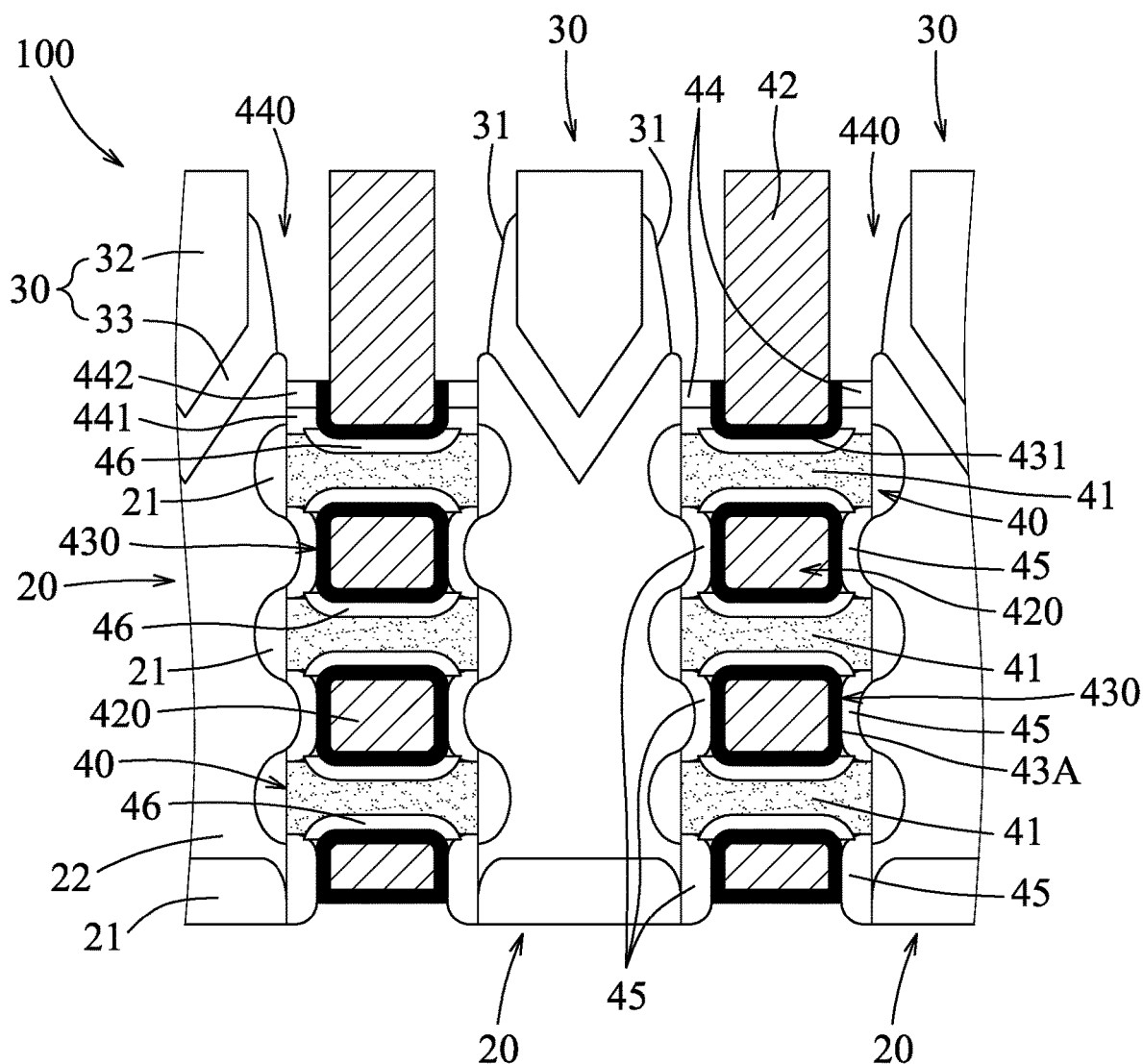

Referring to FIG. 1 and the example illustrated in FIG. 8, the method proceeds to step 107, where the protective layer 300 is removed. In some embodiments, the protective layer 300 is removed by a wet cleaning process such as a standard clean (SC)-1 clean process (known as the first step of a RCA clean process).

The semiconductor structure obtained may be further applied in any suitable applications. It should be noted that some steps in the method may be modified, replaced, or eliminated without departure from the spirit and scope of the present disclosure, and those steps may not be in the order mentioned above.

The embodiments of the present disclosure have the following advantageous features. By applying the alternating electric field (e.g., an electromagnetic radiation) with the selected frequency, the selected element is heated to a temperature higher than those of the other elements, and possesses a higher kinetic energy, which makes the selected element easier to overcome activation energy barrier to be reacted with the removing agent, as such, a higher reaction rate can be obtained, and thereby, the predetermined part of the selected element can be removed at a higher removal rate.

In accordance with some embodiments of the present disclosure, a method for treating a semiconductor structure includes: applying an alternating electric field with a selected frequency to the semiconductor structure such that a selected element of the semiconductor structure is selectively heated by the alternating electric field to have a temperature higher than those of other elements of the semiconductor structure; and removing at least a part of the selected element.

In accordance with some embodiments of the present disclosure, under the alternating electric field with the selected frequency, the selected element has a loss tangent which is greater than a loss tangent of each of the other elements, thereby selectively heating the selected element.

In accordance with some embodiments of the present disclosure, the selected frequency ranges from 3 GHz to 300 GHz.

In accordance with some embodiments of the present disclosure, the alternating electric field is applied using a millimeter wave antenna device.

In accordance with some embodiments of the present disclosure, the alternating electric field is applied intermittently so as to prevent the other elements of the semiconductor structure from being heated up by the selected element.

In accordance with some embodiments of the present disclosure, the selected element includes at least one of silicon oxide, silicon nitride, silicon carbide, silicon oxynitride, silicon oxycarbide, silicon carbon oxynitride, zinc oxide, hafnium oxide, hafnium zirconium oxide, zirconium oxide, lanthanum oxide, aluminum oxide, titanium nitride, tungsten nitride, tantalum nitride, molybdenum nitride, and hafnium nitride.

In accordance with some embodiments of the present disclosure, a method for treating a semiconductor structure includes: disposing the semi conductor structure in a chamber; introducing a modifying agent into the chamber to modify a surface part of a dielectric element of the semiconductor structure; and introducing a removing agent into the chamber while applying an electromagnetic radiation with a selected frequency to the chamber so as to permit the dielectric element to be selectively heated by the electromagnetic radiation to have a temperature higher than those of other elements of the semiconductor structure, and so as to permit the modified surface part of the dielectric element to be removed.

In accordance with some embodiments of the present disclosure, the electromagnetic radiation is applied using a millimeter wave antenna device.

In accordance with some embodiments of the present disclosure, under the electromagnetic radiation with the selected frequency, the dielectric element has a loss tangent greater than a loss tangent of each of the other elements, thereby selectively heating the selected element.

In accordance with some embodiments of the present disclosure, the electromagnetic radiation is applied intermittently so as to prevent the other elements of the semiconductor structure from being heated up by the dielectric element.

In accordance with some embodiments of the present disclosure, the modifying agent is introduced to fluorinate the surface part of the dielectric element.

In accordance with some embodiments of the present disclosure, the removing agent includes a ligand exchange precursor such that a ligand exchange reaction occurs between the ligand exchange precursor and the fluorinated surface part of the dielectric element, thereby removing the fluorinated surface part.

In accordance with some embodiments of the present disclosure, the method further includes introducing a cleaning agent to remove a residue on a remaining part of the dielectric element after the ligand exchange reaction.

In accordance with some embodiments of the present disclosure, the method further includes: forming a protective layer on the semiconductor structure to expose the surface part of the dielectric element before introducing the modifying agent; and removing the protective layer after removing the residue on the remaining part of the dielectric element.

In accordance with some embodiments of the present disclosure, introduction of the modifying agent, introduction of the removing agent while applying the electromagnetic radiation, and introduction of the cleaning agent are repeated in such order for a predetermined number of cycles.

In accordance with some embodiments of the present disclosure, introduction of the modifying agent, introduction of the removing agent while applying the electromagnetic radiation, and introduction of the cleaning agent are repeated in such order until a predetermined part of the dielectric element is removed.

In accordance with some embodiments of the present disclosure, a method for treating a semiconductor structure includes: disposing the semiconductor structure in a chamber, the semiconductor structure including two source/drain portions, two isolation portions respectively formed on the source/drain portions, a channel layer interconnecting the source/drain portions, a gate portion disposed on the channel layer and between the isolation portions, and a gate dielectric portion having a lower dielectric region which is disposed to separate the gate portion from the channel layer, and two lateral dielectric regions which are disposed at two opposite sides of the gate portion to be spaced apart from the isolation portions, respectively; forming a protective layer to cover upper surfaces of the isolation portions, the gate portion and the lateral dielectric region such that lateral surfaces of the lateral dielectric regions are exposed from the protective layer; introducing a modifying agent into the chamber to modify a surface part of the lateral dielectric regions through the lateral surfaces of the lateral dielectric regions; and introducing a removing agent into the chamber while applying an electromagnetic radiation with a selected frequency to the chamber so as to permit the gate dielectric portion to be selectively heated by the electromagnetic radiation to have a temperature higher than those of the source/drain portions, the isolation portions, the channel layer, and the gate portion, and so as to permit the modified surface part of the lateral dielectric regions to be removed using the removing agent.

In accordance with some embodiments of the present disclosure, under the electromagnetic radiation with the selected frequency, the gate dielectric portion has a loss tangent greater than a loss tangent of each of the source/drain portions, the isolation portions, the channel layer, and the gate portion, thereby selectively heating the gate dielectric portion.

In accordance with some embodiments of the present disclosure, the protective layer is formed by directionally depositing of boron nitride on the upper surfaces of the isolation portions, the gate portion, and the lateral dielectric region.

In accordance with some embodiments of the present disclosure, the protective layer is formed by introducing a directional plasma to carbonize or oxidize the upper surfaces of the isolation portions, the gate portion, and the lateral dielectric region.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for treating a semiconductor structure, comprising:

applying an alternating electric field with a selected frequency to the semiconductor structure such that a selected element of the semiconductor structure is selectively heated by the alternating electric field to have a temperature higher than a temperature of each of other elements of the semiconductor structure; and removing at least a part of the selected element, wherein the alternating electric field is applied using a millimeter wave antenna device.

2. The method according to claim 1, wherein, under the alternating electric field with the selected frequency, the selected element has a loss tangent which is greater than a loss tangent of each of the other elements, thereby selectively heating the selected element.

3. The method according to claim 1, wherein the alternating electric field is applied intermittently so as to prevent the other elements of the semiconductor structure from being heated up by the selected element.

4. The method according to claim 1, wherein the selected element includes at least one of silicon oxide, silicon nitride, silicon carbide, silicon oxynitride, silicon oxycarbide, silicon carbon oxynitride, zinc oxide, hafnium oxide, hafnium zirconium oxide, zirconium oxide, lanthanum oxide, aluminum oxide, titanium nitride, tungsten nitride, tantalum nitride, molybdenum nitride, and hafnium nitride.

5. A method for treating a semiconductor structure, comprising:

disposing the semiconductor structure in a chamber;

introducing a modifying agent into the chamber to modify a surface part of a dielectric element of the semiconductor structure; and introducing a removing agent into the chamber while applying an electromagnetic radiation with a selected frequency to the chamber so as to permit the dielectric element to be selectively heated by the electromagnetic radiation to have a temperature higher than a temperature of each of other elements of the semiconductor structure, and so as to permit the modified surface part of the dielectric element to be removed, wherein the electromagnetic radiation is applied using a millimeter wave antenna device.

6. The method according to claim 5, wherein, under the electromagnetic radiation with the selected frequency, the dielectric element has a loss tangent greater than a loss tangent of each of the other elements, thereby selectively heating the dielectric element.

7. The method according to claim 5, wherein the electromagnetic radiation is applied intermittently so as to prevent the other elements of the semiconductor structure from being heated up by the dielectric element.

8. The method according to claim 5, wherein the modifying agent is introduced to fluorinate the surface part of the dielectric element.

9. The method according to claim 8, wherein the removing agent includes a ligand exchange precursor such that a ligand exchange reaction occurs between the ligand exchange precursor and the fluorinated surface part of the dielectric element, thereby removing the fluorinated surface part.

10. The method according to claim 9, further comprising:

introducing a cleaning agent to remove a residue on a remaining part of the dielectric element after the ligand exchange reaction.

11. The method according to claim 10, further comprising:

forming a protective layer on the semiconductor structure to expose the surface part of the dielectric element before introducing the modifying agent; and removing the protective layer after removing the residue on the remaining part of the dielectric element.

12. The method according to claim 11, wherein introduction of the modifying agent, introduction of the removing agent while applying the electromagnetic radiation, and introduction of the cleaning agent are repeated in such order for a predetermined number of cycles.

13. The method according to claim 11, wherein introduction of the modifying agent, introduction of the removing agent while applying the electromagnetic radiation, and introduction of the cleaning agent are repeated in such order until a predetermined part of the dielectric element is removed.

14. A method for treating a semiconductor structure, comprising:

disposing the semiconductor structure in a chamber, the semiconductor structure including
two source/drain portions,
two isolation portions respectively formed on the two source/drain portions,
a channel layer interconnecting the two source/drain portions,
a gate portion disposed on the channel layer and between the two isolation portions, and
a gate dielectric portion having a lower dielectric region which is disposed to separate the gate portion from the channel layer, and two lateral dielectric regions which are disposed at two opposite sides of the gate portion to be spaced apart from the two isolation portions, respectively;

forming a protective layer to cover upper surfaces of the two isolation portions, the gate portion and the two lateral dielectric region such that lateral surfaces of the two lateral dielectric regions are exposed from the protective layer;

introducing a modifying agent into the chamber to modify a surface part of the two lateral dielectric regions through the lateral surfaces of the two lateral dielectric regions; and introducing a removing agent into the chamber while applying an electromagnetic radiation with a selected frequency to the chamber so as to permit the gate dielectric portion to be selectively heated by the electromagnetic radiation to have a temperature higher than a temperature of each of the two source/drain portions, the two isolation portions, the channel layer, and the gate portion, and so as to permit the modified surface part of the two lateral dielectric regions to be removed using the removing agent.

15. The method according to claim 14, wherein, under the electromagnetic radiation with the selected frequency, the gate dielectric portion has a loss tangent greater than a loss tangent of each of the two source/drain portions, the two isolation portions, the channel layer, and the gate portion, thereby selectively heating the gate dielectric portion.

16. The method according to claim 14, wherein the protective layer is formed by directionally depositing boron nitride on the upper surfaces of the two isolation portions, the gate portion, and the two lateral dielectric regions.

17. The method according to claim 14, wherein the protective layer is formed by introducing a directional plasma to carbonize or oxidize the upper surfaces of the two isolation portions, the gate portion, and the two lateral dielectric regions.

18. The method according to claim 14, wherein the protective layer has a thickness ranging from 1.5 nm to 5.0 nm.

19. The method according to claim 14, wherein the semiconductor structure further includes two gate spacers which are disposed on the channel layer and at two opposite sides of the gate dielectric portion, the two lateral dielectric regions being exposed from the two gate spacers.

20. The method according to claim 14, wherein the surface part of the two lateral dielectric regions is modified into a fluorinated surface part that serves as the modified surface part of the two lateral dielectric regions, and the removing agent includes a ligand exchange precursor such that a ligand exchange reaction occurs between the ligand exchange precursor and the modified surface part of the two lateral dielectric regions, thereby removing the modified surface part of the two lateral dielectric regions.

* * * * *